United States Patent
Pyo

(10) Patent No.: US 6,492,268 B1
(45) Date of Patent: *Dec. 10, 2002

(54) METHOD OF FORMING A COPPER WIRING IN A SEMICONDUCTOR DEVICE

(75) Inventor: Sung Gyu Pyo, Kyungki-Do (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 58 days.

This patent is subject to a terminal disclaimer.

(21) Appl. No.: 09/721,967

(22) Filed: Nov. 27, 2000

(30) Foreign Application Priority Data

Dec. 22, 1999 (KR) .......................................... 99/60561

(51) Int. Cl.$^7$ ............................................. H01L 21/44

(52) U.S. Cl. ..................... 438/687; 438/624; 438/633; 438/637; 438/681; 438/652; 438/672

(58) Field of Search .............................. 438/618, 620, 438/622, 626, 624, 627, 629, 637, 631, 633, 638, 643, 645, 652, 653, 666, 669, 667, 668, 672, 681, 687, 692; 257/751, 774

(56) References Cited

U.S. PATENT DOCUMENTS

| | | | | |
|---|---|---|---|---|
| 5,391,517 A | * | 2/1995 | Gelatos et al. | 438/643 |
| 5,821,168 A | * | 10/1998 | Jain | 438/692 |
| 6,165,555 A | * | 12/2000 | Jun et al. | 427/252 |
| 6,207,222 B1 | * | 3/2001 | Chen et al. | 427/97 |
| 6,207,558 B1 | * | 3/2001 | Singhvi et al. | 438/648 |
| 6,337,276 B1 | * | 1/2002 | Pyo | 438/687 |
| 6,346,478 B1 | * | 2/2002 | Pyo et al. | 438/687 |

FOREIGN PATENT DOCUMENTS

| | | | | |
|---|---|---|---|---|
| EP | 0989203 A1 | | 3/2000 | ........... C23C/16/18 |
| GB | 2345298 A | | 7/2000 | ........... C23C/16/44 |
| GB | 2348888 A | | 10/2000 | ........... C23C/16/18 |
| JP | 94-281043 | | 11/1994 | ........... H01L/21/28 |
| JP | 7-188254 | | 7/1995 | ............. C07F/7/02 |
| KR | WO 00/63461 | * | 10/2000 | ........... C23C/18/38 |

OTHER PUBLICATIONS

Rober et al., "Influence of carrier gas on cu nucleation film properties and MOCVD reactions kinetics", 1998, Materials for Advanced Metallization, pp. 25–26.*

Kang et al. "(Hfac) Cu(I)(MP) (hfac=hexafluroacetylacetonate, MP=4–methyl–1–pentene) and (hfac) Cu (I)(DMB) (DMB = 3,3–dimethl–1–butene) for the chemical vapor depostion of copper film", 1999, Elsevier, pp. 10–11.*

* cited by examiner

Primary Examiner—Carl Whitehead, Jr.
Assistant Examiner—Maria Guerrero
(74) Attorney, Agent, or Firm—Finnegan, Henderson, Farabow, Garrett & Dunner, L.L.P.

(57) ABSTRACT

There is disclosed a method of forming a copper wiring in a semiconductor device. The method establishes a new process technology by which a seed layer is formed by a metal organic chemical vapor deposition method using 1,1,1,5,5,5,5-hexafluoro-2, 4-pentadionato (3,3-dimethyl-1-butene)-copper(I) ((hfac)Cu(DMB)) compound as a copper precursor, by optimally setting deposition process conditions of Cu deposition equipment and filling Cu by either a electroplating method or a electroless-plating method. An alternate method establishes a new process technology by which a first seed layer is formed by physical vapor deposition method, a second seed layer is formed on the first seed layer by a metal organic chemical vapor deposition method using the ((hfac)Cu(DMB)) compound as a copper precursor and Cu is then filled by electroplating method or electroless-plating method. Thus, according to the present invention, the new process technology can not only realize reappearance of the copper deposition process but also obtain a copper thin film having a good film quality.

55 Claims, 3 Drawing Sheets

METHOD OF FORMING A COPPER WIRING IN A SEMICONDUCTOR DEVICE

FIELD OF THE INVENTION

The invention relates generally to a method of forming a copper wiring in a semiconductor device, and more particularly to, a method of forming a copper wiring in a semiconductor device capable of not only realizing reappearance (also expressed as reproducibility) of the copper deposition process but also obtaining a copper thin film having a good film quality by establishing a metal organic chemical vapor deposition (MOCVD) process technology in which 1,1,1,5,5,5-hexafluoro-2, 4-pentadionato (3,3-dimethyl-1-butene)-copper(I) (hereinafter called (hfac)Cu(DMB)) compound is used as a copper precursor.

BACKGROUND OF THE INVENTION

As semiconductor industries move into an ultra large scale integration (ULSI), the geometry of devices reduces to a sub-half-micron region, while the circuit density thereof become increased in view of improved performance and reliability. Due to these reasons, a copper thin film is usually employed as an interconnection material useful in an integration circuit since the melting point of the copper thin film is higher than that of an aluminum thin film in forming a metal wiring in a semiconductor device. The use of copper thin film as interconnection material improves the reliability of a semiconductor device due to its higher resistance against electro-migration (EM) and increases signal transfer speed due to its low resistivity.

In a method of forming copper wiring, the copper deposition process is important in realizing higher device reliability and higher integrated device transfer speeds. Accordingly, various deposition methods are implemented when forming copper wiring, such as physical vapor deposition (PVD), electroplating, electroless-plating, and metal organic chemical vapor deposition (MOCVD). Because the MOCVD deposition method is significantly affected by a copper precursor, there is a need for a process that can easily deposit a copper precursor. Furthermore, a delivery system by which the copper can be safely moved must also be developed.

The MOCVD method of copper deposition may employ several types of liquid delivery systems (hereinafter called LDS), including: an LDS employing a bubbler method; an LDS such as direct liquid injection (hereinafter called DLI); an LDS such as control evaporation mixing (hereinafter called CEM); and an LDS having a vaporizer of an orifice type or a spray type. A compound comprising a copper metal called a precursor in an LDS is degraded to form a copper deposition.

In the copper precursor used in MOCVD, two compounds were developed. These compounds were copper II valence (Cu) compound such as 1,1,1,5,5,5-hexafluoro-2,4-pentadionato-copper(II) and Cu (hfac)$_2$ compound, each having a low vapor pressure. Following the development of these two compounds, another compound, copper I valence (Cu$^I$), has been developed. Copper I valence (Cu$^I$) has a high deposition speed since it has a higher vapor pressure than the copper II valence compound and allows high quality copper thin film deposition in a low temperature of 150–250° C. The 1,1,1,5,5,5-hexafluoro-2,4-pentadionato (trimethylvinylsilane)-copper (I) (hereinafter called (hfac)Cu(TMVS)) compound of the currently-developed various copper I valence compounds is a representative copper precursor for use in MOCVD that has been widely used since it remains at a liquid phase at room temperature and allows a high quality copper thin film at a low temperature. Even with these advantages, however, the (hfac)Cu(TMVS) compound has a problem that it is degraded at room temperature. Thus, the (hfac)Cu(TMVS) compound has difficulty in reappearance when applied to the process of manufacturing a semiconductor device. Accordingly, although the (hfac)Cu(TMVS) compound has an advantage over the several developed precursors because of its vapor pressure characteristics, it has problems in securing reappearance in the conventional LDS. As such, the (hfac)Cu(TMVS) compound will have great difficulty in securing reappearance unless a new LDS that can safely carry copper precursor is developed. Further, because the range between the vaporization temperature and the condensation temperature in the (hfac)Cu(TMVS) compound is extremely narrow, there is a problem of maintaining the temperature constant. Also, the (hfac)Cu(TMVS) compound can only be safely used for about one year if it is used with a stabilizer.

In order to solve the problems with in the (hfac)Cu(TMVS) compound, a (hfac)Cu(DMB) compound has been developed as a precursor. The (hfac)Cu(DMB) compound is a new compound that is developed using 3,3-dimethyl-1-butene (hereinafter called DMB) as Lewis base ligand. DMB used in this compound has a low molecular weight and high vapor pressure. Because the (hfac)Cu(DMB) compound uses DMB instead of a methyl group of VTMS as a Lewis base ligand, the compound has a higher in a vapor pressure than the (hfac)Cu(TMVS). Therefore, the (hfac)Cu(DMB) compound is a good precursor since it can significantly improve poor deposition speed, which is one of the biggest problems in a MOCVD Cu precursor. However, because MOCVD process technology that employs a (hfac)Cu(DMB) precursor in a conventional LDS has not been established, the (hfac)Cu(DMB) compound has not been commercialized.

SUMMARY OF THE INVENTION

It is therefore an object of the present invention to provide a method of forming a copper wiring in a semiconductor device capable of not only realizing reappearance of copper deposition process without developing a new LDS but also obtaining a copper thin film having a good film quality deposition process. This is performed by optimally setting the conditions of a copper deposition apparatus to establish a MOCVD process technology in which a (hfac)Cu(DMB) compound is used as a precursor.

In order to accomplish the above object, a method of forming a copper wiring in a semiconductor device according to the present invention is characterized in that it comprises the steps of: forming an interlayer insulating film on a semiconductor substrate in which various components for forming a semiconductor device are formed; forming a contact hole and a trench on said interlayer insulating film; forming a diffusion barrier layer on the surface of said interlayer insulating film including said contact hole and said trench; depositing in-situ a Cu seed layer on the surface of said contact hole and said trench on which said diffusion barrier layer is deposited using a (hfac)Cu(DMB) precursor by metal organic chemical vapor deposition (MOCVD) method; plating Cu so that said contact hole and said trench on which said Cu seed layer can be sufficiently filled using a plating method; and performing a chemical mechanical polishing to form a Cu wiring.

Also a method of forming a copper wiring in a semiconductor device according to the present invention is characterized in that it comprises the steps of: forming an interlayer insulating film on a semiconductor substrate in which various components for forming a semiconductor device are formed; forming a contact hole and a trench on said interlayer insulating film and then forming a diffusion barrier layer on the surface of said interlayer insulating film including said contact hole and said trench; depositing in-situ a first Cu seed layer on the surface of said contact hole and said trench on which said diffusion barrier layer is deposited by a physical vapor deposition method; depositing a second Cu seed layer on the surface of said contact hole and said trench on which said first Cu seed layer is deposited, using a (hfac)Cu(DMB) precursor by metal organic chemical vapor deposition method; plating Cu so that said contact hole and said trench on which said first and second Cu seed layers are stacked can be sufficiently filled, by a plating method; and performing a chemical mechanical polishing process to form a copper wiring.

The copper seed layer deposited using the (hfac)Cu(DMB) precursor by a MOCVD method uses a copper deposition apparatus comprising a reactive chamber and a liquid delivery system. The liquid delivery system includes a bubbler, a direct liquid injection system, a control evaporation mixer, a system having a vaporizer of an orifice type, and a system having a vaporizer of a spray type.

The deposition conditions of the copper seed layer includes maintaining the temperature of a means for vaporizing a (hfac)Cu(DMB) precursor in a liquid delivery system, for example a canister of a bubbler, a vaporizer of a direct liquid injection, a control valve of a vaporizer in a control evaporation mixer and a vaporizer of an orifice type or a spray type, to be in the range of 20–120° C. Also, the deposition conditions of the copper seed layer keeps the temperature of gas lines and source lines from the liquid delivery system to the reactive chamber, the internal temperature of the reactive chamber and the temperature of the showering head in the reactive chamber to be the same as the temperature for vaporizing the (hfac)Cu(DMB) precursor.

In addition, the deposition conditions of the copper seed layer are as follows: the temperature of the susceptor plate in the reactive chamber is in the range of 120–280° C., the internal pressure of the reactive chamber is in the range of 0.1–5 torr, the distance between the showering head and the susceptor plate in the reactive chamber is in the range of 1–50 mm and the flow ratio of the (hfac)Cu(DMB) precursor is in the range of 0.1–1.0 sccm.

BRIEF DESCRIPTION OF THE DRAWINGS

The aforementioned aspects and other features of the present invention will be explained in the following description, taken in conjunction with the accompanying drawings, wherein.

DESCRIPTION OF THE PREFERRED EMBODIMENTS

Figure 1:
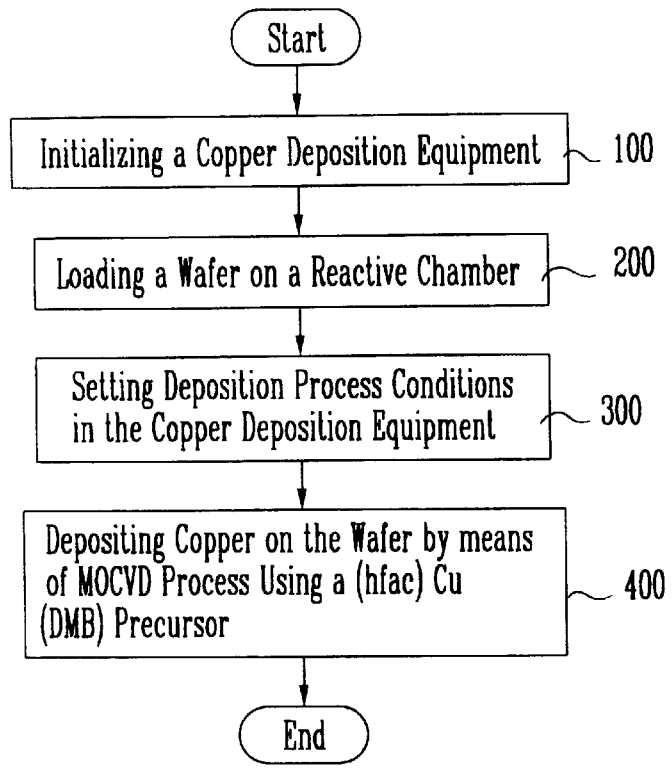
FIG. 1 is a flowchart for explaining a method of forming a copper wiring in a semiconductor device according to the present invention.

The present invention will be described in detail by way of a preferred embodiment with reference to accompanying drawings, in which like reference numerals are used to identify the same or similar parts.

Referring now to FIG. 1, there is shown a flowchart for explaining a method of forming a copper wiring in a semiconductor device according to the present invention.

A copper deposition process according to the present invention begins with the step of initializing a copper deposition (step 100). When the initializing step is complete, a wafer, on which copper will be deposited, is loaded into a reactive chamber (step 200). After the wafer is placed in the chamber, the deposition process conditions are set in the copper deposition equipment (step 300). Finally, when the deposition process conditions are set, copper is deposited on the wafer by means of MOCVD process using a (hfac)Cu(DMB) precursor (step 400).

Among the process steps, the step of setting deposition process conditions in the copper deposition equipment 300 is an important step for accomplishing the object of the present invention. In other words, only when the deposition process conditions are optimally set can the MOCVD process technology using the (hfac)Cu(DMB) compound be established.

In order to optimally set the deposition process conditions in the copper deposition equipment, the characteristics of the copper deposition equipment and the characteristics of the (hfac)Cu(DMB) compound as a copper precursor must be known.

The characteristics of the (hfac)Cu(DMB) compound of a copper precursor are as follows:

When the (hfac)Cu(DMB) precursor is compared with the (hfac)Cu(TMVS) precursor in structure, there is no difference in structure only except that Si is replaced with C in the middle of neutral ligand in the (hfac)Cu(DMB) precursor. Reviewing the results of TGANDSC on the (hfac)Cu(TMVS) precursor and the (hfac)Cu(DMB) precursor, it has been found that the (hfac)Cu(TMVS) precursor is degraded at a temperature of 63° C. while the (hfac)Cu(DMB) precursor is degraded at a temperature of about 90° C. Thus, it can be seen that the (hfac)Cu(DMB) precursor has good thermal stability. Along with thermal stability, one of the most important characteristics affecting the precursor is vapor pressure.

Reviewing the results of measuring vapor pressure, it has been found that the (hfac)Cu(DMB) precursor has a vapor pressure nearly 1 order higher than the (hfac)Cu(TMVS) precursor. In fact, the vapor pressure of the (hfac)Cu(TMVS) precursor is 0.67 at a temperature of 55° C. while that of the (hfac)Cu(DMB) precursor is 2.01 at a temperature of 43.5° C., 3.10 at a temperature of 54° C., 5.26 at a temperature of 66° C., 8.75 at a temperature of 78° C. and 12.93 at a temperature of 88° C. Also, it has been reported that the (hfac)Cu(DMB) precursor generates degradation deposits at the temperature of about 96° C. Thus, it can be seen that the degradation temperature of the (hfac)Cu(DMB) precursor is higher than that of the (hfac)Cu(TMVS) precursor. Considering these results, because the degradation temperature of the (hfac)Cu(DMB) precursor is much higher than that of the (hfac)Cu(TMVS) precursor, it has the potential by which much higher vaporization temperature can be available. Also, because the (hfac)Cu(DMB) precursor has a much higher vapor pressure, it can easily obtain the deposition speed of more than 1000 Å/min.

The characteristics of the copper deposition equipment used for performing a MOCVD process using the (hfac)Cu (DMB) compound is as follows:

The copper deposition equipment used in the MOCVD process generally comprises a LDS and a reactive chamber. A representative LDS currently applied to carry a copper precursor includes a bubbler, DLI system, CEM, and a LDS having a vaporizer of an orifice type or a spray type etc.

Figure 2:
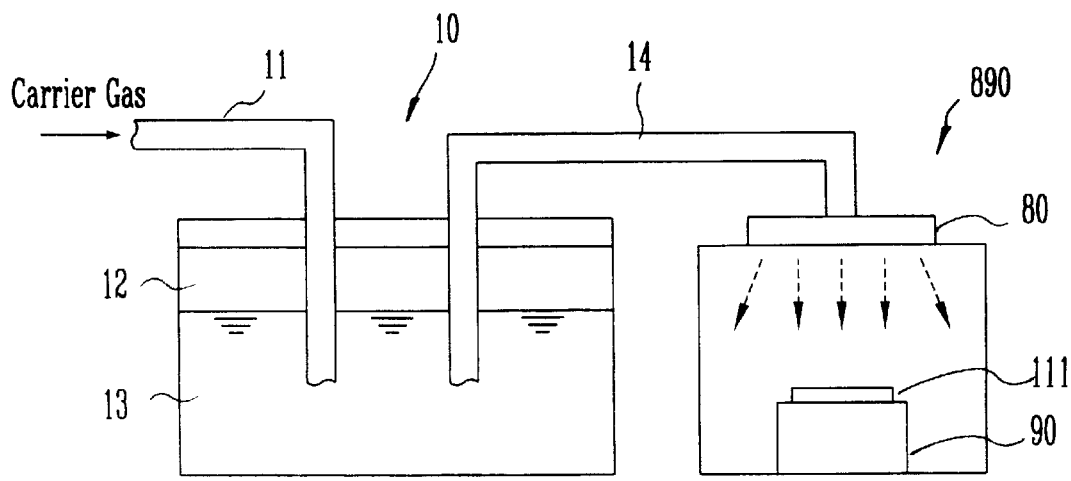
FIG. 2 is a schematic view of a bubbler including a reactive chamber, for explaining a method of forming a copper wiring in a semiconductor device according to the present invention.

FIG. 2 is a schematic view of a bubbler including a reactive chamber, for explaining a method of forming a copper wiring in a semiconductor device according to the present invention;

The bubbler 10 includes a carrier gas inflow line 11, a canister 12, an evaporation gas inflow/outflow line 14. The MOCVD process using the bubbler 10 includes inducing a carrier gas into the canister 12 via the carrier gas inflow line 11, mixing the induced carrier gas with a metal liquid material 13 contained in the canister 12 at a given ratio and then inducing the mixed carrier gas into the reactive chamber 890 via the evaporation gas inflow/outflow line 14.

The reactive chamber 890 is consisted of a showering head 80 for spraying the vaporized material supplied from the bubbler 10 and a susceptor plate 90 for loading a wafer 111.

In the bubbler 10, the ratio of the carrier gas to the metal liquid material is decided by the flow rate of the carrier gas, the temperature of the bubbler and the internal pressure of the bubbler. This type of the bubbler is not suitable for use in a liquid material having a low vapor pressure such as a copper liquid material. Specially, because the temperature of the bubbler must be maintained constant, the copper liquid material is degraded and particles are thus generated from it. Accordingly, there are problems that it adversely affects the semiconductor deposition film, lowers its reappearance and causes a very low deposition speed.

Figure 3:
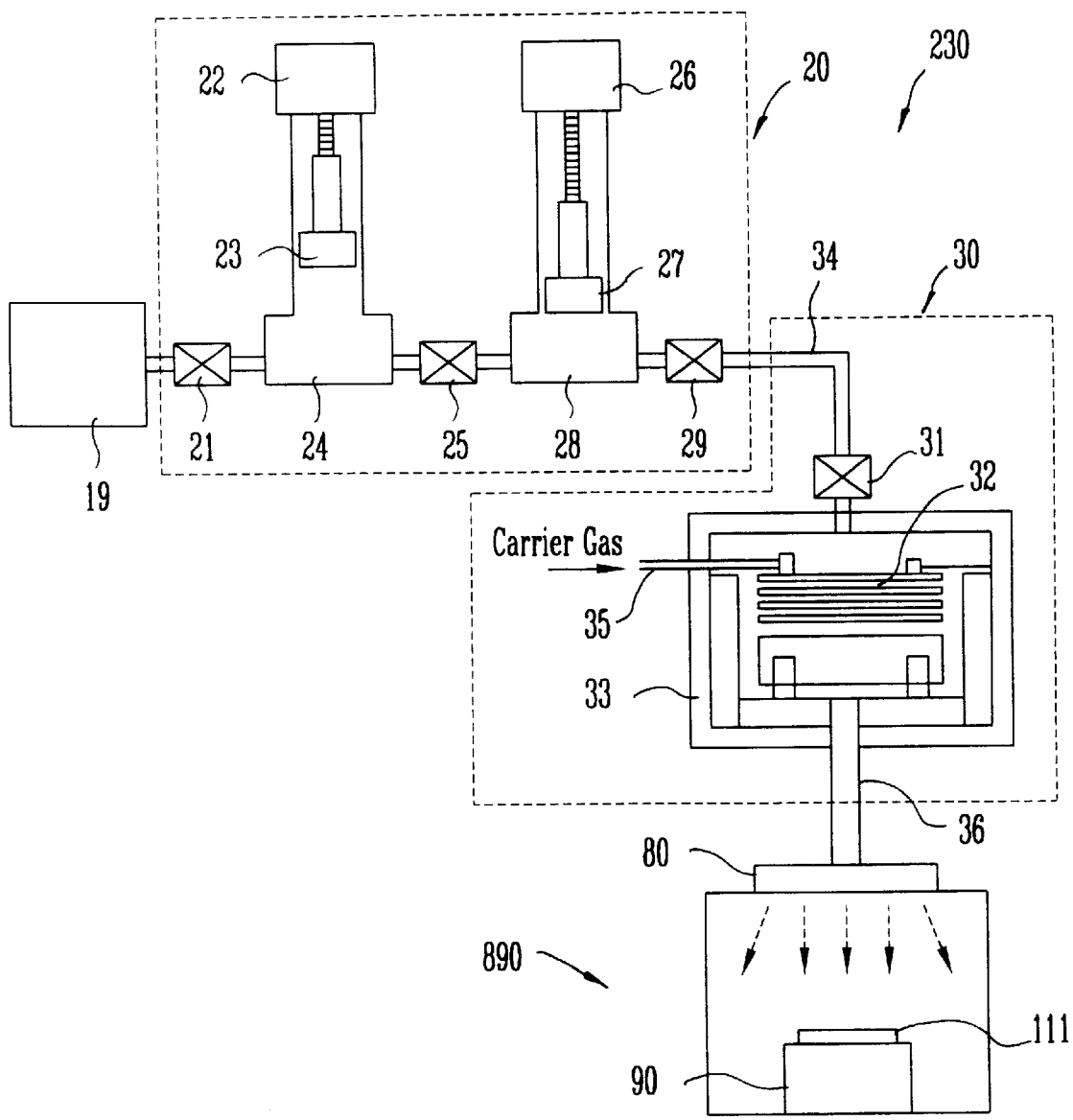
FIG. 3 is a schematic view of a DLI including a reactive chamber, for explaining a method of forming a copper wiring in a semiconductor device according to the present invention.

FIG. 3 is a schematic view of a DLI system including a reactive chamber, for explaining a method of forming a copper wiring in a semiconductor device according to the present invention.

The DLI system 230 consists of a micro-pump 20 and a vaporizer 30 and has a structure in which liquid materials are vaporized from a metal disk 32. The liquid material of an ampule 19 is pressurized at a pressure of about 20 psi and then transferred to the micro-pump 20 via a first valve 21. At this time, while a first stepping motor 22 raises a first piston 23, the liquid material fills in the first cylinder 24. Then, while the first valve 21 is closed, a second valve 25 is opened, the first piston 23 is lowered and the second stepping motor 26 raises the second piston 27, thus allowing the liquid material filled in the first cylinder 24 to fill the second cylinder 28 via the second valve 25. Thereafter, as the second valve 25 is closed, the third valve 29 is opened and the second piston 27 is lowered, the liquid material is transferred to the vaporizer 30 via the third valve 29. At this time, as the first valve 21 is opened and the first piston is raised the liquid material fills in the first cylinder 24 again. With these repeating operations, the liquid material is supplied into the vaporizer 30 via the micro-pump pump 20. Flow control is determined by the number of cycles of the first and second stepping motors 22 and 26. The liquid material supplied from the micro-pump 20 is induced into the 99-metal disks 32 via the delivery valve 31 provided on the liquid inflow line 34, and then vaporized by a heating zone 33. The vaporized gas is induced into the reactive chamber 890 via the evaporation gas inflow/outflow line 36 along with a carrier gas induced via the carrier gas inflow line 35.

The reactive chamber 890 comprises a showering head 80 for spraying the vaporized material supplied from the DLI system 230 and a susceptor plate 90 for loading the wafer 111.

The DLI system 230 is constructed such that the liquid material therein is induced between the 99-stacked metal disks 32 and then vaporized at the vaporizer 30. Thus, the DLI system 230 provides good thermal exchange efficiency since it has a very wide thermal exchange and can transfer the induced liquid material in a wide range of pressures, including several tens through several hundreds psi. However, because the internal pressure of the vaporizer 30 is maintained at a very low pressure of about several Torr, the DLI system 230 can give a volume expanding effect depending on the difference of the pressure. Thus, the DLI can maximize vaporization efficiency. However, the DLI system has the disadvantage that it is difficult to maintain the pressure of the liquid material constant and it takes a very long time to get the pressure of the liquid material at a state of equilibrium. Reaching equilibrium takes a long time because the DLI system relies on the induced liquid material to drive the metal disks 32 and it is constructed so that the micro-pump 20 can form the pressure. Further, when the liquid material is suctioned at an initial state, there is a problem that the vaporizer 30 is clogged since a large amount of liquid material induced into the metal disks 32 remained un-vaporized.

Figure 4:
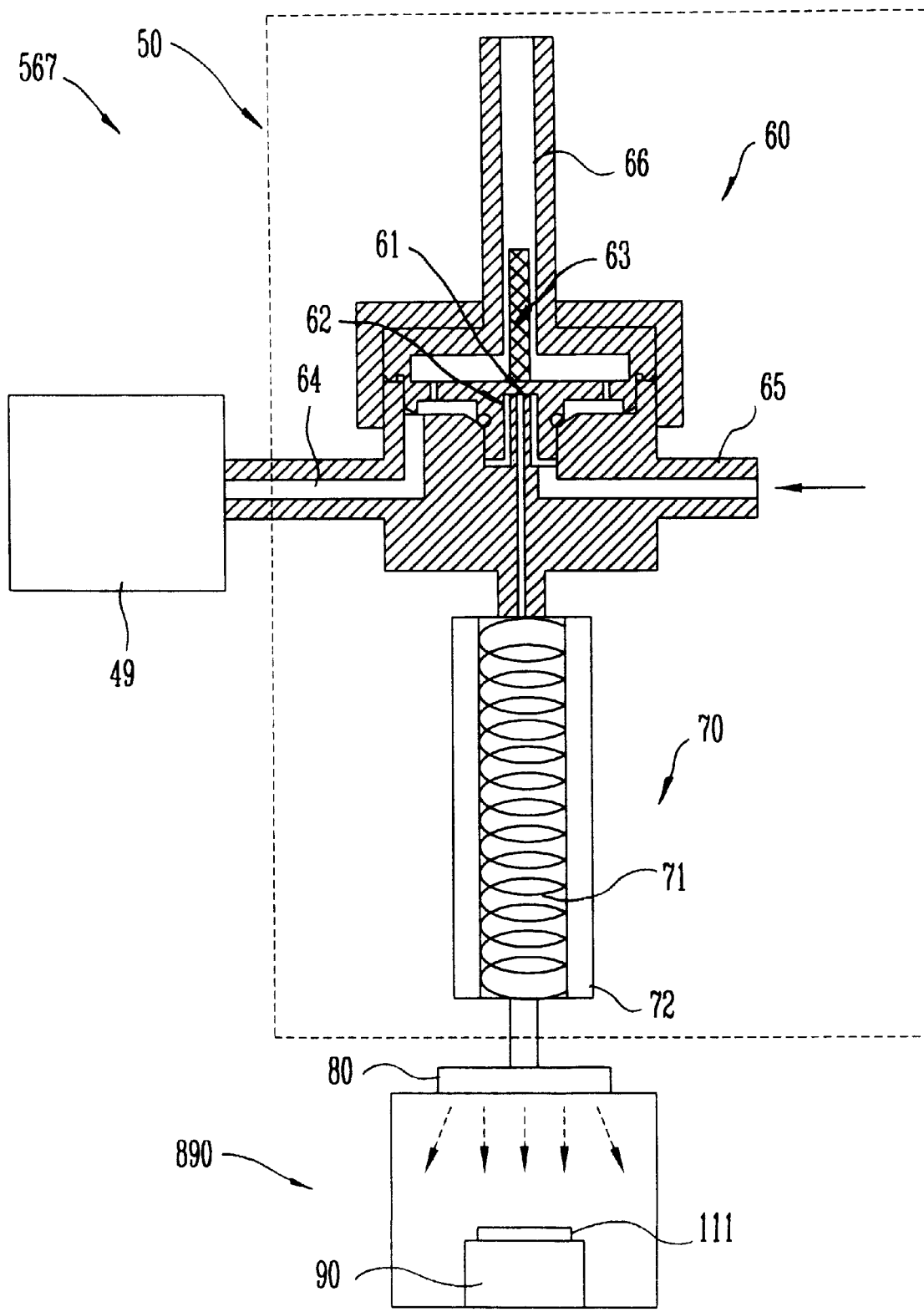
FIG. 4 is a schematic view of a CEM including a reactive chamber, for explaining a method of forming a copper wiring in a semiconductor device according to the present invention.

FIG. 4 is a schematic view of a CEM including a reactive chamber, for explaining a method of forming a copper wiring in a semiconductor device according to the present invention.

The CEM 567 consists of a liquid mass flow controller 49 (hereinafter called LMFC) and a vaporizer 50, wherein a liquid material is vaporized at a heat exchanger 70. The vaporizer 50 consists of a control valve 60 and a heat exchanger 70. The control valve 60 comprises an orifice 61, a mixer 52 and actuator 63, a liquid inflow line 64 for supplying a liquid material, a carrier gas inflow line 65 for supplying a carrier gas and a liquid vent line 66. The heat exchanger 70 is provided with a spiral tube 71. When the carrier gas passes through the mixer 62, a severe spiral flow is formed, so that the liquid material passed through the orifice 61 is transferred to the heat exchanger 70 in the form of mist. The liquid material mixed with the carrier gas at the mixer 62 is vaporized while passing through the spiral tube 71. Then, the vaporized gas is induced into the reactive chamber 890 via the vaporized gas inflow/outflow line 72.

The reactive chamber 890 consists of a showering head 80 for spraying the vaporized material supplied from the CEM 567 and a susceptor plate 90 for loading the wafer 10.

In the vaporizer 50 of the CEM 567, the orifice 61 will rarely clog since it is not vaporization is generated at a long spiral tube 71, there is a problem that particles are likely to form due to condensation and degradation of the liquid material.

In the case of depositing copper by a MOCVD method using a (hfac)Cu(DMB) compound as a copper precursor and the bubbler 10 provided with the reactive chamber shown in FIG. 2, the copper deposition process conditions for realizing a reproducible copper deposition process are as follows:

In order to vaporize the copper precursor (hfac)Cu(DMB) compound, the temperature of the canister 12 is kept in the range of 20–120° C. The carrier gases induced into the canister 12 via the carrier gas inflow line 11 may include helium (He), hydrogen ($H_2$) and argon (Ar), and the flow rate thereof is in the range of 10–700 sccm. In order to improve the conductance of the (hfac)Cu(DMB) compound while preventing the degradation and condensation thereof that is vaporized at the canister 12, the temperature of all the gas lines and the source lines extending from the canister 12, to the reactive chamber 890 are kept the same as that of the canister 12. In order to completely evacuate impurities while the vaporized (hfac)Cu(DMB) compound induced into the reactive chamber 890 is degraded, the internal temperature of the reactive chamber 890 and the temperature of the showering head 80 are kept the same as that of the canister 12. This creates an environment from which pure copper components can then be deposited on the wafer 111. At this time, the temperature of the susceptor plate 90 into which the wafer 111 is loaded is kept in the range of 120–280° C. Also, the internal pressure of the reactive chamber 890 is kept in the range of 0.1–5 torr. The distance between the showering head 80 and the susceptor plate 90 is 1–50 mm. The (hfac)Cu(DMB) compound used as a copper precursor can be used without any additives. However, when any additive is used in the (hfac)Cu(DMB) compound, the DMB of 0.1–30% can be added or Hhfac of 0.1–20% can be added or a combination of DMB and Hhfac can be added, as a additive.

In case of depositing copper by a MOCVD method using a (hfac)Cu(DMB) compound as a copper precursor and the DLI 230 system provided with the reactive chamber 890 shown in FIG. 3, the copper deposition process conditions for realizing a reproducible copper deposition process are as follows:

The temperature of the vaporizer 30 for vaporizing the (hfac)Cu(DMB) compound being a copper precursor is kept in the range of 20–120° C. The temperature of the carrier gas induced into the vaporizer 30 is controlled to be in the range of 40–140° C. which is 20° C. higher than that of the vaporizer 30, so that the compound can be completely evacuated. At this time, available carrier gases may include helium (He), hydrogen ($H_2$) and argon (Ar), and the flow rate thereof is in the range of 10–700 sccm. In order to improve the conductance of the (hfac)Cu(DMB) compound while preventing the degradation and condensation thereof that is vaporized at the vaporizer 30, the temperature of all the gas lines and the source lines from the vaporizer 30 to the reactive chamber 890 are kept the same as that of the vaporizer 30. In order to completely evacuate impurities while the vaporized (hfac)Cu(DMB) compound induced into the reactive chamber 890 is degraded, the internal temperature of the reactive chamber 890 and the temperature of the showering head 80 are kept the same as that of the vaporizer 30. This creates an environment from which pure copper components can be deposited on the wafer 111. At this time, the temperature of the susceptor plate plate 90 into which the wafer 111 is loaded is kept in the range of 120–280° C. Also, the internal pressure of the reactive chamber 890 is kept in the range of 0.1–5 torr. The distance between the showering head 80 and the susceptor plate 90 is 1–50 mm. The flow rate of the (hfac)Cu(DMB) compound is in the range of 0.1–1.0 sccm. In the above process, the (hfac)Cu(DMB) compound being a copper precursor can be used without any additives. However, when any additive is used in the (hfac)Cu(DMB) compound, the DMB of 0.1–30% can be added or Hhfac of 0.1–20% can be added or a combination of DMB and Hhfac can be added, as a additive.

In the case of depositing copper by a MOCVD method using a (hfac)Cu(DMB) compound as a copper precursor and the CEM 567 provided with the reactive chamber 890 shown in FIG. 4, the copper deposition process conditions for realizing a reproducible copper deposition process are as follows:

When the carrier gas passes through the mixer 62 in the vaporizer 50 for vaporizing the (hfac)Cu(DMB) compound, a severe spiral flow is formed, so that the (hfac)Cu(DMB) compound passed through the orifice 61 is transferred to the heat exchanger 70 in the form of mist. The temperature of the heat exchanger 70 is kept in the range of 20–120° C. while the temperature of the control valve 60 is kept at room temperature. The temperature of the carrier gas induced into the control valve 60 of the vaporizer 50 can be set higher or lower than that of the temperature of the heat exchanger 70 in the vaporizer 50. At this time, available carrier gases may include helium (He), hydrogen ($H_s$) and argon (Ar), and the flow rate thereof is in the range of 10–700 sccm. In order to improve the conductance of the (hfac)Cu(DMB) compound while preventing the degradation and condensation thereof that is vaporized at the heat exchanger 70 of the vaporizer 50, the temperature of all the gas lines and the source lines extending from the vaporizer 50 to the reactive chamber 890 are kept the same as or 5–20° C. higher than that of the heat exchanger 70 of the vaporizer 50. In order to completely evacuate impurities while the vaporized (hfac)Cu(DMB) compound induced into the reactive chamber 890 is degraded, the internal temperature of the reactive chamber 890 and the temperature of the showering head 80 are kept the same as that of the heat exchanger 70 of the vaporizer 50. This creates an environment from which pure copper components can be deposited on the wafer 111. At this time, the temperature of the susceptor plate 90 into which the wafer 111 is loaded is kept in the range of 120–280° C. Also, the internal pressure of the reactive chamber 890 is kept in the range of 0.1–5 torr. The distance between the showering head 80 and the susceptor plate 90 is 1–50 mm. The flow rate of the (hfac)Cu(DMB) compound being a copper precursor is in the range of 0.1–1.0 sccm. In the above process, the (hfac)Cu(DMB) compound being a copper precursor can be used without any additives. However, when any additive is used in the (hfac)Cu(DMB) compound, the DMB of 0.1–30% can be added or Hhfac of 0.1–20% can be added or a combination of DMB and Hhfac can be added, as a additive.

In the case of depositing copper by a MOCVD method using a (hfac)Cu(DMB) compound as a copper precursor and a liquid delivery system having a vaporizer of an orifice or spray type and provided with a reactive chamber (not shown), the copper deposition process conditions for realizing a reproducible copper deposition process are as follows:

The temperature of the vaporizer for vaporizing the copper precursor (hfac)Cu(DMB) compound is kept in the range of 20–120° C. The temperature of the carrier gas induced into the vaporizer is controlled to be in the range of 40–140° C. which is 20° C. higher than that of the vaporizer, so that the compound can be completely evacuated. At this time, available carrier gases may include helium (He), hydrogen ($H_s$) and argon (Ar), and the flow rate thereof is in the range of 10–700 sccm. In order to improve the conductance of the (hfac)Cu(DMB) compound while preventing the degradation and condensation thereof that is vaporized at the vaporizer, the temperature of all the gas lines and the source lines from the vaporizer to the reactive chamber are kept the same as that of the vaporizer. In order to completely evacuate impurities while the vaporized (hfac)Cu(DMB) compound induced into the reactive chamber is degraded, the internal temperature of the reactive chamber and the temperature of the showering head are kept the same as that of the vaporizer. This creates an environment from which pure copper components can be deposited on the wafer. At this time, the temperature of the susceptor plate into which the wafer is loaded is kept in the range of 120–280° C. Also, the internal pressure of the reactive chamber is kept in the range of 0.1–5 torr. The distance between the showering head and the susceptor plate is 1–5 mm. The flow rate of the (hfac)Cu(DMB) compound is in the range of 0.1–1.0 sccm. In the above process, the (hfac)Cu(DMB) compound being a copper precursor can be used without any additives. However, when any additive is used in the (hfac)Cu(DMB) compound, the DMB of 0.1–30% can be added or Hhfac of 0.1–20% can be added or a combination of DMB and Hhfac can be added, as a additive.

Based on the above copper deposition conditions, a method of forming a copper wiring in a semiconductor device will be now explained in various ways.

In the case of in-situ depositing copper for a Cu seed layer using the (hfac)Cu(DMB) precursor by a MOCVD method and depositing copper for a copper wiring by electroplating method, a method of forming a copper wiring in a semiconductor device according to the present invention is as follows:

An interlayer insulating film is formed on a semiconductor substrate in which various components for forming a semiconductor device are formed. Then, a contact hole and a trench are formed on the interlayer insulating film using a mask followed by a cleaning process. Next, after a diffusion barrier layer is formed on the surface of the interlayer insulating film including the contact hole and the trench, a Cu seed layer is deposited in-situ on the surface of the contact hole and the trench using the (hfac)Cu(DMB) precursor by a MOCVD method. Cu is plated on the resulting surface by an electroplating method, so that the contact hole and the trench into which the CU seed layer is deposited can be sufficiently filled. When the Cu plating is finished, the Cu plated surface is then subject to a hydrogen reduction thermal process and then is subject to a chemical mechanical polishing (hereinafter CMP) process, thus forming a copper wiring.

In the above, the interlayer insulating film is formed of an insulating film having a low dielectric constant below 2.7. The contact hole and the trench are formed in a dual damascene method. The cleaning process may use a RF plasma in case that a bottom layer is made of metals such as tungsten (W) or aluminum (Al), and may use a reactive cleaning method in case that the bottom layer is made of copper (Cu). The diffusion barrier layer may be formed of at least one of ionized PVD TiN, CVD TiN, MOCVD TiN, ionized PVD Ta, ionized PVD TaN, CVD Ta, CVD TaN, CVD WN.

The Cu seed layer is formed by Cu deposition equipment consisting of a reactive chamber and a LDS. The LDS includes a bubbler, a DLI system and a CEM. Also, a LDS having a vaporizer of an orifice or spray type can be used. The conditions of respective copper deposition equipment for depositing the Cu seed layer are the same to that mentioned above. Thus, the detailed description thereof will be omitted.

The (hfac)Cu(DMB) compound used as a copper precursor can be used without any additives. However, when any additive is used in the (hfac)Cu(DMB) compound, the DMB of 0.1–30% can be added or Hhfac of 0.1–20% can be added or a combination of DMB and Hhfac can be added, as a additive. The hydrogen reduction thermal process performs a thermal process in the temperature range of room temperature to 350° C. for 30–180 minutes, under a hydrogen reduction atmosphere. This enables (hfac)Cu(DMB) compound to change into a grain morphology. At this time, the hydrogen reduction atmosphere may use hydrogen ($H_2$) only or a hydrogen mixed gas such as $H_2$+Ar(1–95%), $H_2$+$N_2$ (1–95%). After the CMP process, a post-cleaning process may be performed. The cleaning process and the diffusion barrier forming process are performing in-situ with no time delay. Also, the Cu plating process and the hydrogen reduction thermal process may be performed in-situ with no time delay.

After a Cu seed layer is formed, the wafer is transferred from the deposition equipment to the electroplating chamber for Cu electroplating. The Cu electroplating method may be performed two ways. First, the method may incorporate two steps: a step of removing an oxide film formed on the Cu seed layer and a Cu electroplating step. And second, the Cu electroplating method may also include three steps: a surface cleaning step including a pre-wetting, a step of forming a Cu electroplating seed layer and a Cu electroplating step. The Cu plating solution may contain $H_2SO_4$ of 1–00 g/liter, $H_2SO_4$ of 1–200 g/liter, HCl of 500 ppm etc., an additive of 1–20 ml/liter etc. The electroplating temperature is 0–80° C. The surface cleaning step, including a prewetting, has a dwell time for 1 second to 2 minutes beginning at the time when an electrolyte is induced from the chamber to reach the wafer. In the Cu electroplating process, the current supply method may include: a DC plating method; a 2-step DC plating method; a multi-step DC plating method; a unipolar pulse plating method; a bipolar reverse plating method and a method of using AC.

For example, in the case of applying a multi-step DC plating method to plate Cu, a process of flowing the current of 1–10 A for 0.1 msec–100 sec, stopping the supply of the current and then starting the supply of the current is repeated 2–10 times with the wafer rotated at 5–100 rpm. In the case of applying a pulsed reverse plating method, a forward current flow of 1 mA–20 A is provided for 1 msec–200 sec. The flow is then shut off for 1 msec–30 sec. Next, a reverse current flow at 1–10 A is provided for 1 msec 50 sec. The reverse current flow is then shut off for 1 msec–30 sec. At this time, it is recommended that the mean wafer current density be kept at 1 mA/cm$^2$ –5O A/cm$^2$. After a Cu electroplating layer is formed, a spin and rinse dry process is performed using DI water with a rotational speed of the wafer kept at 100–2500 rpm.

Secondly, in the case of in-situ depositing copper for a Cu seed layer using the (hfac)Cu(DMB) precursor by a MOCVD method and depositing copper for a copper wiring by electroless-plating method, a method of forming a copper wiring in a semiconductor device according to the present invention is as follows.

An interlayer insulating film is formed on a semiconductor substrate in which various components for forming a semiconductor device are formed. Then, a contact hole and a trench are formed on the interlayer insulating film using a mask and are then subject to a cleaning process. Next, after a diffusion barrier layer is formed on the surface of the interlayer insulating film including the contact hole and the trench, a Cu seed layer is deposited in-situ on the surface of the contact hole and the trench using the (hfac)Cu(DMB) precursor by a MOCVD method. Then, Cu is plated enough to fill the contact hole and the trench on which the Cu seed layers is deposited, by electroless-plating method. When the Cu plating is finished, the Cu plated surface is experienced by a hydrogen reduction thermal process and then is subject to a CMP process, thus forming a copper wiring.

In the above process, the interlayer insulating film is formed of an insulating film having a low dielectric constant below 2.7. The contact hole and the trench are formed in a dual damascene method. The cleaning process may use a RF plasma in case that a bottom layer is made of metals such as tungsten (W) or aluminum (Al), and may use a reactive cleaning method in case that the bottom layer is made of copper (Cu). The diffusion barrier layer may be formed of at least one of ionized PVD TiN, CVD TiN, MOCVD TiN, ionized PVD Ta, ionized PVD TaN, CVD Ta, CVD TaN, CVD WN.

The Cu seed layer is formed by Cu deposition equipment consisting of a reactive chamber and a LDS. The LDS includes a bubbler, a DLI system and a CEM. Also, a LDS having a vaporizer of an orifice or spray type can be used. The conditions of each of the copper deposition equipment for depositing the Cu seed layer are same to that mentioned above. Thus, the detailed description thereof will be omitted.

The (hfac)Cu(DMB) compound used as a copper precursor can be used without any additives. However, when any additive is used in the (hfac)Cu(DMB) compound, the DMB of 0.1–30% can be added or Hhfac of 0.1–20% can be added or a combination of DMB and Hhfac can be added as a additive. The hydrogen reduction thermal process performs a thermal process in the temperature range of room temperature to 350° C. for 30–180 minutes under a hydrogen reduction atmosphere. This allows the (hfac)Cu(DMB) compound to change into a grain morphology. At this time, the hydrogen reduction atmosphere may use hydrogen ($H_2$) only or a hydrogen mixed gas such as $H_2$+Ar(1–95%), $H_2$+$N_2$ (1–95%). After a CMP process, a post cleaning process may be formed. The cleaning process and the diffusion barrier forming process are performed in-situ with no time delay. Also, the Cu plating process and the hydrogen reduction thermal process may be performed in-situ with no time delay.

After the Cu seed layer is formed, the method of filling Cu by the electroless-plating method, includes two steps: a step of removing an oxide film formed on the Cu seed layer and a Cu plating step.

In the case of in-situ depositing copper for a first Cu seed layer by a PVD method, depositing copper for a second Cu seed layer using the (hfac)Cu(DMB) precursor by a MOCVD method and depositing copper for a copper thin film by an electroplating method, a method of forming a copper wiring in a semiconductor device according to the present invention is as follows:

An interlayer insulating film is formed on a semiconductor substrate in which various components for forming a semiconductor device are formed. Then, a contact hole and a trench are formed on the interlayer insulating film using a mask and are then subject to a cleaning process. Next, after a diffusion barrier layer is formed on the surface of the interlayer insulating film including the contact hole and the trench, a first Cu seed layer is formed in-situ on the surface of the contact hole and the trench using the PVD method. Then, a second Cu seed layer is deposited on the surface of the contact hole and the trench on which the first Cu seed layer is deposited, using the (hfac)Cu(DMB) precursor by the MOCVD method. Thereafter, Cu is plated enough to fill the contact hole and the trench on which the first and second Cu seed layers are stacked, by an electroplating method. When the Cu plating is finished, the Cu plated surface is subject to a hydrogen reduction thermal process and then is experienced by a CMP process, thus forming a copper wiring.

In the above process, the interlayer insulating film is formed of an insulating film having a low dielectric constant below 2.7. The contact hole and the trench are formed in a dual damascene method. The cleaning process may use a RF plasma in case that a bottom layer is made of metals such as tungsten (W) or aluminum (Al), and may use a reactive cleaning method in case that the bottom layer is made of copper (Cu). The diffusion barrier layer ay be formed of at least one of ionized PVD TiN, CVD TiN, MOCVD TiN, ionized PVD Ta, ionized PVD TaN, CVD Ta, CVD TaN, CVD WN.

The first Cu seed layer is formed in thickness of up to 200 Å and the deposition temperature thereof is 30–300° C.

The second Cu seed layer is formed by Cu deposition equipment consisting of a reactive chamber and a LDS. The LDS includes a bubbler, a DLI system and a CEM. Also, a LDS having a vaporizer for an orifice or spray type may be used. The conditions of the respective copper deposition equipment for depositing the Cu seed layer are the same to that mentioned above. Thus, the detailed description thereof will be omitted.

The (hfac)Cu(DMB) compound used as a copper precursor can be used without any additives. However, when any additive is used in the (hfac)Cu(DMB) compound, the DMB of 0.1–30% can be added or Hhfac of 0.1–20% can be added or a combination of DMB and Hhfac can be added, as a additive. The hydrogen reduction thermal process performs a thermal process in the temperature range of room temperature to 350° C. for 3–180 minutes under a hydrogen reduction atmosphere. This allows the (hfac)Cu(DMB) compound to change into a grain morphology. At this time, the hydrogen reduction atmosphere may use hydrogen ($H_2$) only or a hydrogen mixed gas such as $H_2$+Ar(1–95%), $H_2$+$N_2$ (1–95%) etc. After a CMP process, a post-cleaning process may be performed. The cleaning process and the diffusion barrier forming process are performed. The cleaning process and the diffusion barrier forming process are performed in-situ with no time delay. Also, the Cu plating process and the hydrogen reduction thermal process may be performed in-situ with no time delay.

After a second Cu seed layer is formed, the wafer is transferred from the deposition equipment to the electroplating chamber for Cu electroplating. The Cu electroplating method may be performed two ways. First the method includes two steps: a step of removing an oxide film formed on the Cu seed layer and a Cu electroplating step. Second the method includes three steps: a surface cleaning step including a pre-wetting; a step of forming a Cu electroplating seed layer and a Cu electroplating step. The Cu plating solution may contain $H_2SO_4$ of 1–100 g/liter, $H_2SO_4$ of 1–200 g/liter, HCI of 500 ppm etc., an additive of 1–20 ml/liter etc. The electroplating l temperature is 0–800° C. The surface cleaning step, including pre-wetting, is a step having a dwell time for 1 second–2 minutes beginning at the time when the an electrolyte is induced from the chamber to reach the wafer. In the Cu electroplating process, the current supply method may include: a DC plating method; 2-step DC plating method; a multi-step DC plating method; an unipolar pulse plating method; a bipolar reverse plating method and a method of using AC.

For example, in the case of applying a multi-step DC plating method to plate Cu, a process of flowing the current of 1–10 A for 0.1 msec–100 sec, stopping the supply of the current and then starting the supply of the current is repeated 2–10 times with the wafer rotated at 5–100 rpm. In the case of applying a pulsed reverse plating method, a forward current flow at 1 mA–20 A is provided for 1 msec–200 sec. The flow is then shut off for 1 msec–30 sec. Next, a reverse current flow at 1–10 A is provided for 1 msec–50 sec. The reverse current flow is then shut off for 1 msec–30 sec. At this time, it is recommended that the mean wafer current density be kept at 1 mA/cm$^2$ –50 A/cm$^2$. After the Cu electroplating layer is formed, a spin and rinse dry process is performed using DI water with the rotational speed of the wafer kept at 100–2500 rpm.

In the case of in-situ depositing copper for a first Cu seed layer by a PVD method, depositing copper for a second Cu seed layer using the (hfac)Cu(DMB) precursor by a MOCVD and depositing copper for a copper thin film by electroless-plating method, a method of forming a copper wiring in a semiconductor device according to the present invention is as follows:

An interlayer insulating film is formed on a semiconductor substrate in which various components for forming a semiconductor device are formed. Then, a contact hole and a trench are formed on the interlayer insulating film using a mask and are then subject to a cleaning process. Next, after a diffusion barrier layer is formed on the surface of the interlayer insulating film including the contact hole and the trench, a first Cu seed layer is in-situ formed on the surface of the contact hole and the trench using the PVD method. Then, a second Cu seed layer is deposited on the surface of the contact hole and the trench on which the fist Cu seed layer is deposited, using the (hfac)Cu(DMB) precursor by the MOCVD method. Thereafter, Cu is plated enough to fill the contact hole and the trench on which the first and second Cu seed layers are stacked, by an electroless-plating method. When the Cu plating is finished, the Cu plated surface is experienced by a hydrogen reduction thermal process and then is subject to a CMP process, thus forming a copper wiring.

In the above process, the interlayer insulating film is formed of a insulating film having a low dielectric constant below 2.7. The contact hole and the trench are formed in a dual damascene method. The cleaning process may use a RF plasma in case that a bottom layer is made of metals such as tungsten (W) or aluminum (Al), and may use a reactive cleaning method in case that the bottom layer is made of copper (Cu)). The diffusion barrier layer may be formed of at least one of ionized PVD TiN, CVD TiN, MOCVD TiN, ionized PVD Ta, ionized PVD TaN, CVD Ta, CVD TaN, CVD WN.

The first Cu seed layer is formed in thickness of within 200 Å and the deposition temperature thereof is 30–300° C.

The second Cu seed layer is formed at Cu deposition equipment comprising a reactive chamber and a LDS. The LDS includes a bubbler, a DLI system and a CEM. Also, a LDS having a vaporizer of an orifice or spray type may be used. The conditions of the respective copper deposition equipment for depositing the Cu seed layer are same as that mentioned above. Thus, the detailed description thereof will be omitted.

The (hfac)Cu(DMB) compound used as a copper precursor can be used without any additives. However, when any additive is used in the (hfac)Cu(DMB) compound, the DMB of 0.1–30% can be added or Hhfac of 0.1–20% can be added or a combination of DMB and Hhfac can be added, as a additive. The hydrogen reduction thermal process performs a thermal process in the temperature range of at room temperature to 350° C. for 30–180 minutes under a hydrogen reduction atmosphere. This allows the (hfac)Cu(DMB) compound to change into a grain morphology. At this time, the hydrogen reduction atmosphere may use hydrogen Hz only or a hydrogen mixed gas such as H$_2$+Ar(1–95%), H$_2$+N$_2$ (1–95%). After a CMP process, a post cleaning process may be performed. The cleaning process and the diffusion barrier forming process are performed in-situ with no time delay. Also, the Cu plating process and the hydrogen reduction thermal process may be performed in-situ with no time delay.

After the second Cu layer is formed, a method of filling Cu by the electroless-plating method is performed. The Cu electroless-plating method includes two steps: a step of removing an oxide film formed on the Cu seed layer and a Cu plating step.

As can be understood from the above description, the present invention can not only realize reappearance of the copper deposition process but also obtain a copper thin film having a good film quality. These advantages are obtained by optimally setting the deposition process conditions of the copper deposition apparatus to establish a MOCVD process technology in which a (hfac)Cu(DMB) compound is used as a precursor.

The present invention has been described with reference to a particular embodiment in connection with a particular application. Those having ordinary skill in the art and access to the teachings of the present invention will recognize additional modifications and applications within the scope thereof.

It is therefore intended by the Appended claims to cover any and all such applications, modifications, and embodiments within the scope of the present invention.

What is claimed is:

1. A method of forming a copper wiring in a semiconductor device, comprising the steps of:
    forming an interlayer insulating film on a semiconductor substrate in which various components for forming a semiconductor device are formed;
    forming a contact hole and a trench on said interlayer insulating film;
    forming a diffusion barrier layer on the surface of said interlayer insulating film including said contact hole and said trench;
    depositing in-situ a Cu seed layer on the surface of said contact hole and said trench on which said diffusion barrier layer is deposited using a (hfac)Cu(DMB) precursor by a metal organic chemical vapor deposition (MOCVD) method;
    plating Cu so that said contact hole and said trench on which said Cu seed layer is deposited can be sufficiently filled, by a plating method; and
    performing a chemical mechanical polishing to form a Cu wiring.

2. The method of forming a copper wiring in a semiconductor device according to claim 1, wherein said contact hole and said trench are formed in a dual damascene method.

3. The method of forming a copper wiring in a semiconductor device according to claim 1, wherein said diffusion barrier layer is formed of at least one of ionized PVD TiN, CVD TiN, MOCVD TiN, ionized PVD Ta, ionized PVD TaN, CVD Ta, CVD TaN and CVD WN.

4. The method of forming a copper wiring in a semiconductor device according to claim 1, wherein said plating method employs either an electroplating method or an electroless-plating method.

5. The method of forming a copper wiring in a semiconductor device according to claim 1, wherein the flow ratio of said (hfac) Cu (DMB) precursor is in the range of 0.1–1.0 sccm.

6. The method of forming a copper wiring in a semiconductor device according to claim 1, wherein DMB of 0.1–30% is added or Hhfac of 0.1–20% is added or a combination of DMB and Hhfac is added to the (hfac)Cu(DMB) precursor as an additive.

7. The method of forming a copper wiring in a semiconductor device according to claim 1, wherein after the process of forming said diffusion barrier, a cleaning process is performed, and wherein said cleaning process and said diffusion barrier forming process are performed in-situ with no time delay.

8. The method of forming a copper wiring in a semiconductor device according to claim 1, wherein said Cu seed layer is deposited using a Cu deposition system consisting of a reactive chamber and a liquid delivery system, and wherein said liquid delivery system includes one of a bubbler, a direct liquid injection system, a control evaporation mixer, a system having a vaporizer of an orifice type and a system having a vaporizer of a spray type.

9. The method of forming a copper wiring in a semiconductor device according to claim 1, wherein after said Cu plating process, a hydrogen reduction thermal process is performed in situ with no time delay, wherein the hydrogen reduction thermal process is also performed in a temperature range of room temperature to 350° C. for a time period of 30–180 minutes, under a hydrogen reduction atmosphere.

10. The method of forming a copper wiring in a semiconductor device according to claim 9, wherein said hydrogen reduction atmosphere uses any one of $H_2$, $H_2+Ar$ (1–95%) and $H_2+N_2$(1–95%).

11. The method of forming a copper wiring in a semiconductor device according to claim 8, wherein said liquid delivery system includes a bubbler for vaporizing said (hfac)Cu(DMB) precursor, and where the deposition conditions of said Cu seed layer are as follows:

the temperature of a canister in said bubbler is in the range of 20–120° C., a carrier gas induced into said canister of said bubbler includes at least one of helium (He), hydrogen ($H_2$) and argon (Ar) gas and the flow rate thereof is in the range of 10–700 sccm, and the temperature of gas lines and source lines extending from said canister of said bubbler to said reactive chamber are kept the same as that of said canister of said bubbler.

12. The method of forming a copper wiring in a semiconductor device according to claim 8, wherein the liquid delivery system includes a direct liquid injection system for vaporizing said (hfac)Cu(DMB) precursor, and wherein the conditions of said Cu seed layer are as follows:

the temperature of a vaporizer in said direct liquid injection is in the range of 20–120° C., the temperature of a carrier gas induced into said vaporizer is set 20° C. higher than that of said vaporizer, said carrier gas includes at least one of helium (He), hydrogen ($H_2$), argon (Ar) gas and the flow rate thereof is in the range of 10–100 sccm, and the temperature of gas lines and source lines extending from said vaporizer to said reactive chamber are Kept the same as that of said vaporizer.

13. The method of forming a copper wiring in a semiconductor device according to claim 8, wherein said liquid delivery system includes a control evaporation mixer for vaporizing said (hfac)Cu(DMB) precursor, and wherein the deposition conditions of said Cu seed layer are as follows;

the temperature of a control valve of a vaporizer in said control evaporation mixer is kept at room temperature, the temperature of a heat exchanger in said vaporizer is in the range of 20–120° C., the temperature of a carrier gas induced into said control valve is controlled to be lower or higher than that of the temperature of said heat exchanger, said carrier gas includes at least one of helium (He), hydrogen ($H_2$), argon (Ar) gas and the flow rate thereof is in the range of 10–700 sccm, and the temperature of gas lines and source lines extending from said vaporizer to said reactive chamber are kept the same as or 5–20° C. higher than that of said heat exchanger.

14. The method of forming a copper wiring in a semiconductor device according to claim 8, wherein the liquid delivery system includes a vaporizer of an orifice or spray type for vaporizing said (hfac)Cu(DMB) precursor, and wherein the deposition conditions of said Cu seed layer are as follows:

the temperature of the vaporizer is in the range of 20–120° C., the temperature of a carrier gas induced into said vaporizer is set 20° C. higher than that of said vaporizer, said carrier gas includes at least one of helium (He), hydrogen ($H_2$), argon (Ar) gas and the flow rate thereof is in the range of 10–700 sccm, and the temperature of gas lines and source lines extending from said vaporizer to said reactive chamber are kept the same as that of said vaporizer.

15. The method of forming a copper wiring in a semiconductor device according to claim 8, wherein the conditions of said reactive chamber for depositing said Cu seed layer are as follows:

the internal temperature of said reactive chamber and the temperature of a showering head in said reactive chamber are in the range of 20–120° C., the temperature of a susceptor plate in said reactive chamber is in the range of 120–280° C., the internal pressure of said reactive chamber is in the range of 0.1–5 torr and the distance between said showering head and said susceptor plate in said reactive chamber is in the range of 1–5 mm.

16. A method of forming a copper wiring in a semiconductor device, comprising the steps of:

forming an interlayer insulating film on a semiconductor substrate in which various components for forming a semiconductor device are formed;

forming a contact hole and a trench on said interlayer insulating film;

forming a diffusion barrier layer on the surface of said interlayer insulating film including said contact hole and said trench;

depositing in-situ a first Cu seed layer on the surface of said contact hole and said trench on which said diffusion barrier layer is deposited, by a physical vapor deposition method;

depositing a second Cu seed layer on the surface of said contact hole and said trench on which said first Cu seed layer is deposited, using a (hfac)Cu(DMB) precursor by metal organic chemical vapor deposition method;

plating Cu so that said contact hole and said trench on which said first and second Cu seed layers are stacked can be sufficiently filled, by a plating method; and performing a chemical mechanical polishing process to form a copper wiring.

17. The method of forming a copper wiring in a semiconductor device according to claim 16, wherein said contact hole and said trench are formed in a dual damascene method.

18. The method of forming a copper wiring in a semiconductor device according to claim 16, wherein said diffusion barrier layer is formed of at least one of ionized PVD TiN, CVD TiN, MOCVD TiN, ionized PVD Ta, ionized PVD TaN, CVD Ta, CVD TaN and CVD WN.

19. The method of forming a copper wiring in a semiconductor device according to claim 16, wherein said first Cu seed layer is formed in thickness of about up to 200 Å at the deposition temperature of 30–300° C.

20. The method of forming a copper wiring in a semiconductor device according to claim 16, wherein said plating method employs either an electroplating method or an electroless-plating method.

21. The method of forming a copper wiring in a semiconductor device according to claim 16, wherein the flow ratio of said (hfac)Cu(DMB) precursor is in the range of 0.1–1.0 sccm.

22. The method of forming a copper wiring in a semiconductor device according to claim 16, wherein DMB of 0.1–30% is added or Hhfac of 0.1–20% is added or a combination of DMB and Hhfac is added to said (hfac)Cu (DMB) precursor, as an additive.

23. The method of forming a copper wiring in a semiconductor device according to claim 16, wherein after said diffusion barrier forming process, a cleaning process is performed, and wherein said cleaning process and said diffusion barrier forming process are performed in-sit with no time delay.

24. The method of forming a copper wiring in a semiconductor device according to claim 16, wherein said second Cu seed layer is deposited using a Cu deposition system consisting of a reactive chamber and a liquid delivery system using (hfac)Cu(DMB) precursor by way of MOCVD, and wherein said liquid delivery system includes one of a bubbler, a direct liquid injection system, a control evaporation mixer, a system having a vaporizer of an orifice type and a system having a vaporizer of a spray type.

25. The method of forming a copper wiring in a semiconductor device according to claim 16, wherein after said Cu plating process, a hydrogen reduction thermal process is performed in situ with no time delay and is also performed in a temperature range of room temperature to 350° C. for a time period of 30 to 180 minutes, under a hydrogen reduction atmosphere.

26. The method of forming a copper wiring in a semiconductor device according to claim 25, wherein said hydrogen reduction atmosphere uses any one of $H_2$, $H_2+Ar$ (1–95%) and $H_2+N_2$ (1–95%).

27. The method of forming a copper wiring in a semiconductor device according to claim 24, wherein the liquid delivery system includes a bubbler for vaporizing said (hfac)Cu(DMB) precursor, and wherein the deposition conditions of said second Cu seed layer are as follows:
the temperature of a canister in said bubbler is in the range of 20–120° C., a carrier gas induced into a canister of said bubbler includes at least one of helium (He), hydrogen ($H_2$) and argon (Ar) gas and the flow rate thereof is in the range of 10–700 sccm, and the temperature of gas lines and source lines extending from said canister of said bubbler to said reactive chamber are kept the same as that of said canister of said bubbler.

28. The method of forming a copper wiring in a semiconductor device according to claim 24, wherein the liquid delivery system includes a direct liquid injection system for vaporizing said (hfac) Cu (DMB) precursor, and wherein the deposition conditions of said second Cu seed layer are as follows:
the temperature of a vaporizer in said direct liquid injection system is in the range of 20–120° C., the temperature of a carrier gas induced into said vaporizer is set 20° C. higher than that of said vaporizer, said carrier gas includes at least one of helium (He), hydrogen ($H_2$), argon (Ar) gas and the flow rate thereof is in the range of 10–700 sccm, and the temperature of gas lines and source lines extending from said vaporizer to said reactive chamber are kept the same as that of said vaporizer.

29. The method of forming a copper wiring in a semiconductor device according to claim 24, wherein the liquid delivery system includes a control evaporation mixer for vaporizing said (hfac) Cu (DMB) precursor, wherein the deposition conditions of said second Cu seed layer are as follows:
the temperature of a control valve of said vaporizer in said control evaporation mixer is kept at room temperature, the temperature of a heat exchanger in said vaporizer is in the range of 20–120° C., the temperature of a carrier gas induced into said control valve is controlled to be lower or higher than that of said heat exchanger, said carrier gas includes at least one of helium (He), hydrogen ($H_2$), argon (Ar) gas and the flow rate thereof is in the range of 10–700 sccm, and the temperature of gas lines and source lines extending from said vaporizer to said reactive chamber are kept the same as or 5–20° C. higher than that of said heat exchanger.

30. The method of forming a copper wiring in a semiconductor device according to claim 24, wherein the liquid delivery system includes a liquid delivery system having a vaporizer of an orifice or spray type for vaporizing said (hfac)Cu(DMB) precursor, wherein the deposition conditions of said second Cu seed layer are as follows:
the temperature of said vaporizer is in the range of 20–120° C., the temperature of a carrier gas induced into said vaporizer is set 20° C. higher than that of said vaporizer, said carrier gas includes at least one of helium (He), hydrogen ($H_2$), argon (Ar) gas and the flow rate thereof is in the range of 10–700 sccm, and the temperature of gas lines and source lines extending from said vaporizer to said reactive chamber are kept the same as that of said vaporizer.

31. The method of forming a copper wiring in a semiconductor device according to claim 24, wherein the conditions of said reactive chamber for depositing said second Cu seed layer are as follows:
the internal temperature of said reactive chamber and the temperature of a showering head in said reactive chamber are in the range of 20–120° C., the temperature of a susceptor plate in said reactive chamber is in the range of 120–280° C., the internal pressure of said reactive chamber is kept in the range of 0.1–5 torr and the distance between said showering head and said susceptor plate in said reactive chamber is in the range of 1–50 mm.

32. A method of forming a copper wiring in a semiconductor device, comprising the steps of:
forming an interlayer insulating film on a semiconductor substrate in which various components for forming a semiconductor device are formed;
forming a diffusion barrier layer on the surface of said interlayer insulating film;
depositing in-situ a Cu seed layer on the surface of said diffusion barrier layer using a (hfac)Cu(DMB) precursor by a metal organic chemical vapor deposition (MOCVD) method;
performing a plating method; and performing a chemical mechanical polishing to form a Cu wiring.

33. The method of forming a copper wiring in a semiconductor device according to claim 32, wherein said diffusion barrier layer is formed of at least one of ionized PVD TiN, CVD TiN, MOCVD TiN, ionized PVD Ta, ionized PVD TaN, CVD Ta, CVD TaN and CVD WN.

34. The method of forming a copper wiring in a semiconductor device according to claim 32, wherein said Cu seed layer is deposited using a Cu deposition system consisting of a reactive chamber and a liquid delivery system, and wherein said liquid delivery system includes one of a bubbler, a direct liquid injection system, a control evaporation mixer, a system having a vaporizer of an orifice type and a system having a vaporizer of a spray type.

35. A method of forming a copper wiring in a semiconductor device, comprising the steps of:
 forming an interlayer insulating film on a semiconductor substrate in which various components for forming a semiconductor device are formed;
 forming a diffusion barrier layer on the surface of said interlayer insulating film;
 depositing in-situ a first Cu seed layer on the surface of said diffusion barrier layer;
 depositing a second Cu seed layer on the surface of said contact hole and said trench on which said first Cu seed layer is deposited, using a (hfac)Cu(DMB) precursor by metal organic chemical vapor deposition method;
 performing a plating method; and
 performing a chemical mechanical polishing process to form a copper wiring.

36. The method of forming a copper wiring in a semiconductor device according to claim 35, wherein the step of depositing in-situ a first Cu seed layer on the surface of said diffusion barrier layer is performed by a physical vapor deposition method.

37. The method of forming a copper wiring in a semiconductor device according to claim 35, wherein said diffusion barrier layer is formed of at least one of ionized PVD TiN, CVD TiN, MOCVD TiN, ionized PVD Ta, ionized PVD TaN, CVD Ta, CVD TaN and CVD WN.

38. The method of forming a copper wiring in a semiconductor device according to claim 35, wherein said second Cu seed layer is deposited using a Cu deposition system consisting of a reactive chamber and a liquid delivery system using (hfac)Cu(DMB) precursor by way of MOCVD, and wherein said liquid delivery system includes one of a bubbler, a direct liquid injection system, a control evaporation mixer, a system having a vaporizer of an orifice type and a system having a vaporizer of a spray type.

39. The method of forming a copper wiring in a semiconductor device according to claim 35, wherein said plating method employs either an electroplating method or an electroless-plating method.

40. A method of forming a copper wiring in a semiconductor device, comprising the steps of:
 depositing in-situ a Cu seed layer on the surface of a semiconductor substrate in which various components for forming a semiconductor device are formed using a (hfac)Cu(DMB) precursor by a metal organic chemical vapor deposition (MOCVD) method; and
 performing a chemical mechanical polishing to form a Cu wiring.

41. The method of forming a copper wiring in a semiconductor device according to claim 40, wherein said Cu seed layer is deposited using a Cu deposition system consisting of a reactive chamber and a liquid delivery system, and wherein said liquid delivery system includes one of a bubbler, a direct liquid injection system, a control evaporation mixer, a system having a vaporizer of an orifice type and a system having a vaporizer of a spray type.

42. The method of forming a copper wiring in a semiconductor device according to claim 41, wherein said liquid delivery system includes a bubbler for vaporizing said (hfac)Cu(DMB) precursor, and where the deposition conditions of said Cu seed layer are as follows:
 the temperature of a canister in said bubbler is in the range of 20–120° C., a carrier gas induced into said canister of said bubbler includes at least one of helium (He), hydrogen ($H_2$) and argon (Ar) gas and the flow rate thereof is in the range of 10–700 sccm, and the temperature of gas lines and source lines extending from said canister of said bubbler to said reactive chamber are kept the same as that of said canister of said bubbler.

43. The method of forming a copper wiring in a semiconductor device according to claim 41, wherein the liquid delivery system includes a direct liquid injection system for vaporizing said (hfac)Cu(DMB) precursor, and wherein the conditions of said Cu seed layer are as follows:
 the temperature of a vaporizer in said direct liquid injection is in the range of 20–120° C., the temperature of a carrier gas induced into said vaporizer is set 20° C. higher than that of said vaporizer, said carrier gas includes at least one of helium (He), hydrogen ($H_2$), argon (Ar) gas and the flow rate thereof is in the range of 10–100 sccm, and the temperature of gas lines and source lines extending from said vaporizer to said reactive chamber are kept the same as that of said vaporizer.

44. The method of forming a copper wiring in a semiconductor device according to claim 41, wherein said liquid delivery system includes a control evaporation mixer for vaporizing said (hfac)Cu(DMB) precursor, and wherein the deposition conditions of said Cu seed layer are as follows:
 the temperature of a control valve of a vaporizer in said control evaporation mixer is kept at room temperature, the temperature of a heat exchanger in said vaporizer is in the range of 20–120° C., the temperature of a carrier gas induced into said control valve is controlled to be lower or higher than that of the temperature of said heat exchanger, said carrier gas includes at least one of helium (He), hydrogen ($H_2$), argon (Ar) gas and the flow rate thereof is in the range of 10–700 sccm, and the temperature of gas lines and source lines extending from said vaporizer to said reactive chamber are kept the same as or 5–20° C. higher than that of said heat exchanger.

45. The method of forming a copper wiring in a semiconductor device according to claim 41, wherein the liquid delivery system includes a vaporizer of an orifice or spray type for vaporizing said (hfac)Cu(DMB) precursor, and wherein the deposition conditions of said Cu seed layer are as follows:
 the temperature of the vaporizer is in the range of 20–120° C., the temperature of a carrier gas induced into said vaporizer is set 20° C. higher than that of said vaporizer, said carrier gas includes at least one of helium (He), hydrogen ($H_2$), argon (Ar) gas and the flow rate thereof is in the range of 10–700 sccm, and the temperature of gas lines and source lines extending from said vaporizer to said reactive chamber are kept the same as that of said vaporizer.

46. The method of forming a copper wiring in a semiconductor device according to claim 41, wherein the conditions of said reactive chamber for depositing said Cu seed layer are as follows:

the internal temperature of said reactive chamber and the temperature of a showering head in said reactive chamber are in the range of 20–120° C., the temperature of a susceptor plate in said reactive chamber is in the range of 120–280° C., the internal pressure of said reactive chamber is in the range of 0.1–5 torr and the distance between said showering head and said susceptor plate in said reactive chamber is in the range of 1–50 mm.

47. The method of forming a copper wiring in a semiconductor device according to claim 41, after the step of depositing in-situ a Cu seed layer on the surface of a semiconductor substrate, performing the a plating method, wherein said plating method employs either an electroplating method or an electroless-plating method.

48. The method of forming a copper wiring in a semiconductor device according to claim 41, wherein the flow ratio of said (hfac) Cu (DMB) precursor is in the range of 0.1–1.0 sccm.

49. A method of forming a copper wiring in a semiconductor device, comprising the steps of:

depositing in-situ a first Cu seed layer on the surface of a semiconductor substrate by a physical vapor deposition method; and depositing a second Cu seed layer on the surface of a semiconductor substrate on which said first Cu seed layer is deposited, using a (hfac)Cu(DMB) precursor by metal organic chemical vapor deposition method.

50. The method of forming a copper wiring in a semiconductor device according to claim 49, wherein said second Cu seed layer is deposited using a Cu deposition system consisting of a reactive chamber and a liquid delivery system, and wherein said liquid delivery system includes one of a bubbler, a direct liquid injection system, a control evaporation mixer, a system having a vaporizer of an orifice type and a system having a vaporizer of a spray type.

51. The method of forming a copper wiring in a semiconductor device according to claim 50, wherein said liquid delivery system includes a bubbler for vaporizing said (hfac)Cu(DMB) precursor, and where the deposition conditions of said Cu seed layer are as follows:

the temperature of a canister in said bubbler is in the range of 20–120° C., a carrier gas induced into said canister of said bubbler includes at least one of helium (He), hydrogen ($H_2$) and argon (Ar) gas and the flow rate thereof is in the range of 10–700 sccm, and the temperature of gas lines and source lines extending from said canister of said bubbler to said reactive chamber are kept the same as that of said canister of said bubbler.

52. The method of forming a copper wiring in a semiconductor device according to claim 50, wherein the liquid delivery system includes a direct liquid injection system for vaporizing said (hfac)Cu(DMB) precursor, and wherein the conditions of said Cu seed layer are as follows:

the temperature of a vaporizer in said direct liquid injection is in the range of 20–120° C., the temperature of a carrier gas induced into said vaporizer is set 20° C. higher than that of said vaporizer, said carrier gas includes at least one of helium (He), hydrogen ($H_2$), argon (Ar) gas and the flow rate thereof is in the range of 10–100 sccm, and the temperature of gas lines and source lines extending from said vaporizer to said reactive chamber are kept the same as that of said vaporizer.

53. The method of forming a copper wiring in a semiconductor device according to claim 50, wherein said liquid delivery system includes a control evaporation mixer for vaporizing said (hfac)Cu(DMB) precursor, and wherein the deposition conditions of said Cu seed layer are as follows:

the temperature of a control valve of a vaporizer in said control evaporation mixer is kept at room temperature, the temperature of a heat exchanger in said vaporizer is in the range of 20–120° C., the temperature of a carrier gas induced into said control valve is controlled to be lower or higher than that of the temperature of said heat exchanger, said carrier gas includes at least one of helium (He), hydrogen ($H_2$), argon (Ar) gas and the flow rate thereof is in the range of 10–700 sccm, and the temperature of gas lines and source lines extending from said vaporizer to said reactive chamber are kept the same as or 5–20° C. higher than that of said heat exchanger.

54. The method of forming a copper wiring in a semiconductor device according to claim 50, wherein the liquid delivery system includes a vaporizer of an orifice or spray type for vaporizing said (hfac)Cu(DMB) precursor, and wherein the deposition conditions of said Cu seed layer are as follows:

the temperature of the vaporizer is in the range of 20–120° C., the temperature of a carrier gas induced into said vaporizer is set 20° C. higher than that of said vaporizer, said carrier gas includes at least one of helium (He), hydrogen ($H_2$), argon (Ar) gas and the flow rate thereof is in the range of 10–700 sccm, and the temperature of gas lines and source lines extending from said vaporizer to said reactive chamber are kept the same as that of said vaporizer.

55. The method of forming a copper wiring in a semiconductor device according to claim 50, wherein the conditions of said reactive chamber for depositing said Cu seed layer are as follows:

the internal temperature of said reactive chamber and the temperature of a showering head in said reactive chamber are in the range of 20–120° C., the temperature of a susceptor plate in said reactive chamber is in the range of 120–280° C., the internal pressure of said reactive chamber is in the range of 0.1–5 torr and the distance between said showering head and said susceptor plate in said reactive chamber is in the range of 1–50 mm.

* * * * *